(12) United States Patent
Wang et al.

(10) Patent No.: US 11,873,437 B2
(45) Date of Patent: Jan. 16, 2024

(54) METHOD FOR PREPARING FLUORESCENT NANOMATERIAL-POLYMER COMPOSITE, AND LIGHT EMITTING DEVICE

(71) Applicant: SUZHOU XINGSHUO NANOTECH CO., LTD., Jiangsu (CN)

(72) Inventors: Yunjun Wang, Jiangsu (CN); Bo Ma, Jiangsu (CN)

(73) Assignee: SUZHOU XINGSHUO NANOTECH CO., LTD., Jiangsu (CN)

( * ) Notice: Subject to any disclaimer, the term of this patent is extended or adjusted under 35 U.S.C. 154(b) by 202 days.

(21) Appl. No.: 17/294,420

(22) PCT Filed: Jan. 24, 2019

(86) PCT No.: PCT/CN2019/073002
§ 371 (c)(1),
(2) Date: May 17, 2021

(87) PCT Pub. No.: WO2020/103333
PCT Pub. Date: May 28, 2020

(65) Prior Publication Data
US 2021/0403809 A1    Dec. 30, 2021

(30) Foreign Application Priority Data
Nov. 20, 2018   (CN) ................... 201811381450.4

(51) Int. Cl.
| | | |
|---|---|---|
| *C09K 11/88* | (2006.01) | |
| *C08J 5/18* | (2006.01) | |
| *C08L 63/00* | (2006.01) | |
| *C09K 11/02* | (2006.01) | |
| *H01L 33/50* | (2010.01) | |
| *B82Y 20/00* | (2011.01) | |
| *B82Y 30/00* | (2011.01) | |
| *B82Y 40/00* | (2011.01) | |

(52) U.S. Cl.
CPC ............. *C09K 11/883* (2013.01); *C08J 5/18* (2013.01); *C08L 63/00* (2013.01); *C09K 11/025* (2013.01); *H01L 33/502* (2013.01); *B82Y 20/00* (2013.01); *B82Y 30/00* (2013.01); *B82Y 40/00* (2013.01)

(58) Field of Classification Search
CPC ........................... C09K 11/025; H01L 33/502
See application file for complete search history.

(56) References Cited

U.S. PATENT DOCUMENTS

| | | | | |
|---|---|---|---|---|
| RE41,616 E | * | 8/2010 | Hubbard | ............ G01N 21/6428 528/196 |
| 2010/0264371 A1 | | 10/2010 | Nick | |
| 2011/0081538 A1 | * | 4/2011 | Linton | ..................... C08L 91/06 252/301.36 |
| 2013/0169904 A1 | * | 7/2013 | Kang | .................... G02F 1/1336 349/64 |

FOREIGN PATENT DOCUMENTS

| | | | |
|---|---|---|---|
| CN | 102555130 A | | 7/2012 |
| CN | 103772872 A | | 5/2014 |
| CN | 104393157 A | | 3/2015 |
| CN | 104927686 A | | 9/2015 |
| CN | 106750427 A | | 5/2017 |
| CN | 106950750 A | | 7/2017 |
| CN | 107828416 A | | 3/2018 |
| CN | 108058411 A | | 5/2018 |
| CN | 108129811 A | | 6/2018 |
| CN | 108239797 A | | 7/2018 |
| CN | 108300455 A | | 7/2018 |
| CN | 108373534 A | | 8/2018 |
| JP | 2005008651 A | | 1/2005 |
| JP | 2014513865 A | | 6/2014 |
| JP | 2008056864 A | | 3/2018 |
| WO | 2014129067 A1 | | 8/2014 |
| WO | WO 2015/037968 | * | 3/2015 |
| WO | 2017201465 A1 | | 11/2017 |

* cited by examiner

*Primary Examiner* — C Melissa Koslow
(74) *Attorney, Agent, or Firm* — Gang Yu (57) ABSTRACT

Disclosed are a method for preparing a fluorescent nanomaterial-polymer composite and a wavelength converting element, and a light emitting device. The method for preparing the fluorescent nanomaterial-polymer composite includes: at least one precursor provided, the precursor includes a fluorescent nanomaterial and a polymer; and in a first temperature at or higher than a melting point of the polymer, the precursor is mixed, and then cooled.

11 Claims, 3 Drawing Sheets

METHOD FOR PREPARING FLUORESCENT NANOMATERIAL-POLYMER COMPOSITE, AND LIGHT EMITTING DEVICE

TECHNICAL FIELD

The disclosure relates to the field of fluorescent nanomaterials, and in particular to a method for preparing a fluorescent nanomaterial-polymer composite, and a light emitting device.

BACKGROUND

Fluorescent nanomaterials refer to a series of materials which may convert incident light to generate converted light with a predetermined wavelength, and are widely used in the fields of display and illumination.

The nanomaterial refers to a material which has at least one dimension located in a nanometer size (0.1-100 nm) in a three-dimensional space or is composed of them as basic units, the fluorescent nanomaterial has some advantages that a rare earth fluorescent material does not have.

The fluorescent nanomaterial is generally dispersed in a polymer, and prepared into a wavelength converting element with a predetermined shape for use. However, while the fluorescent nanomaterial is damaged by oxygen, water vapor, and other factors in an external environment, it is caused that stability thereof is poorer, thereby it may not meet requirements for the stability of the wavelength converting element in the fields of the display and illumination.

SUMMARY

According to one aspect of the embodiments of the disclosure, a method for preparing a fluorescent nanomaterial-polymer composite is provided, including: at least one precursor provided, the precursor includes a fluorescent nanomaterial and a polymer; and in a first temperature at or higher than a melting point of the polymer, the precursor is mixed, and then cooled.

Optionally, the fluorescent nanomaterial is selected from at least one of a nanocluster, a quantum dot, a nanorod and a nanodisk.

Optionally, the polymer includes at least one component, the first temperature is greater than or equal to a melting point of the component with the highest melting point in the polymer.

Optionally, a crystallinity of the polymer is greater than 5%.

Optionally, a value of the first temperature is between 90 and 310° C.

Optionally, the polymer includes at least one of a vinyl polymer, a propenyl polymer, a thiol-ene polymer, a (methyl)acrylate polymer, a carbamate polymer, a carbonate polymer, an epoxy polymer, a paraffin wax and an organosilicon polymer.

Optionally, the precursor further includes a solvent, and the solvent is selected from at least one of a $C_6$-$C_{22}$ amine compound, a nitrogen-containing heterocyclic compound, a $C_6$-$C_{40}$ aliphatic hydrocarbon, a $C_6$-$C_{30}$ aromatic hydrocarbon, a $C_6$-$C_{22}$ phosphine oxide compound, and a $C_{12}$-$C_{22}$ aromatic ether.

Optionally, the precursor further includes a hydrocarbon additive, and under a normal pressure, a boiling point of at least one component in the hydrocarbon additive is higher than the first temperature.

According to another aspect of the embodiments of disclosure, a method for preparing a wavelength converting element is provided, the preparation method includes: through forming treatment to the fluorescent nanomaterial-polymer composite mentioned above, the wavelength converting element with a predetermined shape is acquired.

Optionally, the predetermined shape includes a particle shape, a film shape, a fiber shape, a tube shape, a bubble shape or a bowl shape.

Optionally, the forming treatment includes coating forming, laminating forming, casting forming, cold press molding, transfer molding, low pressure forming, extrusion forming, extrusion-stretch forming, injection forming or blow forming.

Optionally, particles of the above fluorescent nanomaterial-polymer composite are dispersed in a second polymer, the second polymer is the same as or different from the first polymer; and while any one direction of the particles of the fluorescent nanomaterial-polymer composite is defined as an X-axis, any one direction perpendicular to the X-axis is defined as a Y-axis, and any one direction perpendicular to a plane formed by the X-axis and the Y-axis is defined as a Z-axis, a particle size of the fluorescent nanomaterial-polymer composite is 0.1 µm or more and 100 µm or less in the X-axis, 0.1 µm or more and 100 µm or less in the Y-axis, and 0.1 µm or more and 100 µm or less in the Z-axis.

Optionally, after the particles of the above fluorescent nanomaterial-polymer composite are mixed with resin solution of the photocuring second polymer, the wavelength converting element with the predetermined shape is obtained by light curing forming.

Optionally, after the particles of the above fluorescent nanomaterial-polymer composite are mixed with a resin of the thermocuring second polymer, the wavelength converting element with the predetermined shape is obtained by heat curing forming.

Optionally, after the particles of the above fluorescent nanomaterial-polymer composite are mixed with the molten second polymer, the wavelength converting element with the predetermined shape is obtained by cool forming.

Optionally, the predetermined shape includes a particle shape, a film shape, a fiber shape, a tube shape, a bubble shape or a bowl shape.

According to another aspect of the embodiments of the disclosure, a light emitting device is provided, and the light emitting device includes a light source and a wavelength converting element prepared by the method mentioned above, the wavelength converting element receives light from the light source, and converts it into light with another wavelength.

DETAILED DESCRIPTION OF THE EMBODIMENTS

Technical schemes in embodiments of the disclosure are described in detail below in combination with implementation modes of the disclosure. It should be noted that the implementation modes described are only a part of the implementation modes of the disclosure, and not all of the implementation modes.

According to some exemplary implementation modes of the disclosure, a method for preparing a fluorescent nanomaterial-polymer composite includes: at least one precursor is provided, the precursor includes a fluorescent nanomaterial and a polymer; and in a first temperature at or higher than a melting point of the polymer, the precursor is mixed, and then cooled.

The fluorescent nanomaterial refers to a material which may emit light with another wavelength after receiving light with a certain wavelength. In an exemplary implementation mode of the disclosure, a substance which may be served as the fluorescent nanomaterial is selected from at least one of a nanocluster, a quantum dot, a nanorod and a nanodisk, but is not limited to this. In some embodiments of the disclosure, a half-width of an emission peak of the fluorescent nanomaterial is preferably less than 60 nm, and excitation light may be purple light, blue-violet light or blue light and the like.

In some embodiments of the disclosure, the nanocluster refers to a relatively stable microscopic or submicroscopic aggregate formed by several or even thousands of atoms, molecules or ions through a physical or chemical binding force. A three-dimensional size of the nanocluster is generally about 0.1 nm to 10 nm. In some embodiments of the disclosure of the disclosure, the nanocluster includes but is not limited to an Ag cluster, an Au cluster, an IIB-VIA cluster, an IIIA-VA cluster, an IVA-VIA cluster, an IVA cluster, an IB-IIIA-VIA cluster, and a VIII-VIA cluster.

In some embodiments of the disclosure, the nanorod is a nano-sized structure having a diameter of tens and even hundreds of nanometers and a large length-width ratio. In some embodiments of the disclosure of the disclosure, the nanorod includes but is not limited to an Ag nanorod, an Au nanorod, a Cu nanorod, an IIB-VIA family nanorod, an IIIA-VA family nanorod, an IVA-VIA family nanorod, an IVA family nanorod, an IB-IIIA-VIA family nanorod, a VIII-VIA family nanorod or a perovskite nanorod. For example, specifically, the nanorod includes but is not limited to a CdSe/ZnS nanorod, a CdZnS/ZnS nanorod, an InP/ZnS nanorod, a PbSe nanorod, a PbS nanorod, a PbSe/CdS nanorod, a PbSe/ZnS nanorod, an $MAPbBr_3$ nanorod, a $CsPbBr_3$ nanorod, a $CuInS_2$ nanorod, an Ag nanorod, an Au nanorod, a Cu nanorod and the like.

In some embodiments of the disclosure, the nanodisk may also be called as "nanosheet", "nanoflake", "two-dimensional nanoparticle" or "nanoplate" and the like, interchangeably refer to a nanoparticle having one dimension smaller than the other two dimensions; the smallest size dimension (hereinafter referred to as a thickness) is 0.1 to 100 nanometers. In the sense of the disclosure, the other two dimensions (hereinafter referred to as a length and a width) may be 1 to 100 times of the thickness. The nanodisk includes but is not limited to an IIB-VIA family nanodisk, an IIIA-VA family nanodisk, an IVA-VIA family nanodisk, an IVA family nanodisk, an IB-IIIA-VIA family nanodisk, a VIII-VIA family nanodisk, a perovskite nanodisk or a transition metal dichalcogenide nanodisk. For example, specifically, the nanodisk includes but is not limited to a CdSe/ZnS nanodisk, a CdZnS/ZnS nanodisk, an InP/ZnS nanodisk, a CdSe/CdZnS nanodisk, a PbSe nanodisk, a PbS nanodisk, an $MAPbBr_3$ nanodisk, a $CsPbBr_3$ nanodisk, a $CuInS_2$ nanodisk, an $MoO_2$ nanodisk, an $MoS_2$ nanodisk, an $MoSe_2$ nanodisk, an $MoTe_2$ nanodisk, a $WS_2$ nanodisk and the like. And the meaning of MA is Methylammonium.

Different from an organic phosphorescent molecule or a fluorescent molecule, the fluorescent nanomaterial has a larger specific surface area, so that it is poorer in stability to other environmental factors such as light and heat. In the related art, high-temperature treatment is generally avoided from being used for the fluorescent nanomaterial, because this may cause deterioration of the optical property and stability of the fluorescent nanomaterial. While the fluorescent nanomaterial-polymer composite is prepared, a most common mode is to directly disperse the fluorescent nanomaterial in polymer resin solution, and it is obtained through photocuring or thermocuring. However, it is discovered in an experiment by the inventor that for most commonly used polymers such as a polyacrylic resin and a polyepoxy resin, the optical stability of the fluorescent nanomaterial-polymer composite prepared by this mode is still poorer, and the water and oxygen protection ability of the polymer to the fluorescent nanomaterial is weaker.

While the fluorescent nanomaterial-polymer composite is prepared, another most common mode is to use a swelling method, the fluorescent nanomaterial is coated in the polymer. For example, firstly the polymer is dissolved by using a solvent, and mixed with the fluorescent nanomaterial, and then the solvent is drained. In some embodiments of the disclosure, it is unexpectedly discovered by the inventor that it is very different from the swelling method, while the fluorescent nanomaterial is used to mix with the molten polymer, and after cooling treatment, service life of the fluorescent nanomaterial in the fluorescent nanomaterial-polymer composite prepared by this method is significantly improved. In addition, the disclosure directly mixes the fluorescent nanomaterial with the molten polymer, the preparation method is simple, and is particularly suitable for large-scale preparation.

In an exemplary implementation mode of the disclosure, a weight content of the fluorescent nanomaterial in the fluorescent nanomaterial-polymer composite is 0.01 wt %-50 wt %, preferably 0.1 wt %-10 wt %, and more preferably 0.5 wt %-5 wt %.

As used herein, a term "melting point" refers to a highest temperature of a melting range of the polymer. Because the polymer is not formed by a completely same crystal, a completely same degree of polymerization, and a completely same polymer chain segment, and in a process of heating and melting the polymer, a non-crystal domain area of the polymer may be preferentially melted, and a crystal domain area also needs a higher melting temperature. Therefore, the "melting point" generally represents a temperature at which a crystal structure of the polymer crystal domain area is destroyed. In some embodiments of the disclosure, the first temperature is higher than the melting point of the polymer, it means that it is higher than a maximum temperature of the melting range of the polymer.

In the embodiments of the disclosure, quantum dots refer to nanoparticles of which three-dimensional sizes are all within 100 nm. Shapes of the nanoparticles include, but are not limited to, a spherical shape, an ellipsoidal shape, a polyhedral shape and the like.

In some embodiments of the disclosure, the size of the quantum dot is preferably 1-15 nm. The quantum dots may be IIB-VIA family quantum dots, IIIA-VA family quantum dots, IVA-VIA family quantum dots, IVA family quantum dots, IB-IIIA-VIA family quantum dots, VIII-VIA family quantum dots or perovskite quantum dots, but not limited to this.

In some embodiments of the disclosure, the IIB-VIA family quantum dots are not just limited to a two-element structure formed by an IIB family element and a VIA family element, but also a three-element structure, for example, formed by two IIB family elements and one VIA family element or formed by one IIB family element and two VIA family elements; it may also be a four-element structure, for example, formed by two IIB family elements and two VIA family elements. The IIB-VIA family quantum dots may be a single-housing or multi-housing structure. For example, while the single-housing layer is ZnS, the IIB-VIA family quantum dots may be CdSe/ZnS, CdSeS/ZnS and the like; for example, while the multi-housing layer is ZnSe/ZnS, the IIB-VIA family quantum dots may be CdSe/ZnSe/ZnS, CdSeS/ZnSe/ZnS and the like. Similar to the IIB-VIA family quantum dots, the IIIA-VA family quantum dots, the IVA-VIA family quantum dots, the IVA family quantum dots, the IB-IIIA-VIA family quantum dots, and the VIII-VIA family quantum dots are not limited to one element or two elements or three elements.

In an exemplary implementation mode, the quantum dots include but are not limited to CdSe, CdTe, ZnS, ZnSe, ZnTe, ZnO, HgS, PbS, HgSe, HgTe, MgSe, MgS, PbS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, HgZnTeS, CdZnSeS, CdZnSeTe, CdZnSTe, CdHgSTe, CdZnSTe, CdHgSTe, CdZnSTe, CdHgSTe, HgZnS, AlN, AlP, AlAs, AlSb, InN, InP, InAs, InSb, GaNP, GaNAS, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, CuInS2, C, Si, SiC, but not limited this.

The "perovskite" refers to a compound having a perovskite crystal structure. The perovskite crystal structure refers to a three-dimensional (3D) crystal structure corresponding to a crystal structure of $CaTiO_3$. In an exemplary implementation mode, the quantum dots include, but are not limited to, perovskite quantum dots having a compound represented by Chemical Formula 1.

Chemical Formula 1: $ABX_3$. Herein, in Chemical Formula 1, A is at least one monovalent organic cation, at least one monovalent inorganic cation or any combinations thereof, B is at least one divalent inorganic cation, and X is at least one monovalent anion.

In some exemplary implementation modes of the disclosure, in Chemical Formula 1, A is $(R_1R_2R_3C)^+$, $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, substituted or unsubstituted cycloheptatriene, substituted or unsubstituted nitrogen-containing five-membered ring monovalent cation, substituted or unsubstituted nitrogen-containing six-membered ring monovalent cation, $Li^+$, $Na^+$, $K^+$, $Rb^+$, $Cs^+$, $Fr^+$ or any combinations thereof.

$R_1$ to $R_5$ are each independently selected from hydrogen, deuterium, —F, —Cl, —Br, —I, a hydroxyl, substituted or unsubstituted $C_1$-$C_{60}$ alkyl, substituted or unsubstituted $C_2$-$C_{60}$ alkenyl, substituted or unsubstituted $C_2$-$C_{60}$ alkynyl, substituted or unsubstituted $C_1$-$C_{60}$ alkoxy, substituted or unsubstituted $C_6$-$C_{60}$ aryl or —$N(Q_1)(Q_2)$.

At least one substituent of the substituted cycloheptatriene, the substituted nitrogen-containing five-membered ring monovalent cation and the substituted nitrogen-containing six-membered ring monovalent cation is selected from deuterium, —F, —Cl, —Br, —I, a hydroxyl, substituted or unsubstituted $C_1$-$C_{60}$ alkyl, substituted or unsubstituted $C_2$-$C_{60}$ alkenyl, substituted or unsubstituted $C_2$-$C_{60}$ alkynyl, substituted or unsubstituted $C_1$-$C_{60}$ alkoxy, substituted or unsubstituted $C_6$-$C_{60}$ aryl or —$N(Q_3)(Q_4)$, and $Q_1$ to $Q_4$ are each independently selected from hydrogen, deuterium, hydroxyl, $C_1$-$C_{60}$ alkyl, $C_2$-$C_{60}$ alkenyl, $C_2$-$C_{60}$ alkynyl, $C_1$-$C_{60}$ alkoxy or $C_6$-$C_{60}$ aryl.

As used herein, phrases "nitrogen-containing five-membered ring" and "nitrogen-containing six-membered ring" refer to an organic cyclic group including at least one nitrogen (N) atom and at least one carbon (C) atom as ring-forming atoms.

For example, the "nitrogen-containing five-membered ring" group may be an imidazole, a pyrazole, a thiazole, an oxazole, a pyrrolidine, a pyrroline, a pyrrole or a triazole, and the "nitrogen-containing six-membered ring" group may be a pyridine, a pyridazine, a pyrimidine, a pyrazine or a piperidine. However, the exemplary implementation mode of the disclosure is not limited this.

In some implementation modes of the disclosure, in Chemical Formula 1, A is $(NH_4)^+$, $(PH_4)^+$, $(AsH_4)^+$, $(SbH_4)^+$, $(NF_4)^+$, $(PF_4)^+$, $(NCl_4)^+$, $(PCl_4)^+$, $(CH_3NH_3)^+$, $(CH_3PH_3)^+$, $(CH_3AsH_3)^+$, $(CH_3SbH_3)^+$, $((CH_3)_2NH_2)^+$, $((CH_3)_2PH_2)^+$, $((CH_3)_2AsH_2)^+$, $((CH_3)_2SbH_2)^+$, $((CH_3)_3NH)^+$, $((CH_3)_3PH)^+$, $((CH_3)_3AsH)^+$, $((CH_3)_3SbH)^+$, $((CH_3CH_2)NH_3)^+$, $((CH_3CH_2)PH_3)^+$, $((CH_3CH_2)AsH_3)^+$, $((CH_3CH_2)SbH_3)^+$, $(CH_2N_2H_4)^+$, $(C_7H_7)^+$, $(NH_3OH)^+$, $(NH_3NH_2)^+$, $((CH_2)_3NH_2)^+$, $(CH(NH_2)_2)^+$, $(C_3N_2H_5)^+$, $(NC_4He)^+$, $((NH_2)_3C)^+$, $K^+$, $Rb^+$, $Cs^+$ or any combinations thereof. However, the exemplary implementation modes of the disclosure are not limited this.

In Chemical Formula 1, B may be at least one divalent inorganic cation. For example, the B in Chemical Formula 1 may be one divalent inorganic cation or a combination of at least two different divalent inorganic cations.

In some exemplary implementation modes of the disclosure, the B may be a divalent cation of rare earth metal, a divalent cation of alkaline earth metal, a divalent cation of transition metal, a divalent cation of late transition metal, or any combinations thereof. For example, the B may be $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Tm^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, $Pb^{2+}$, $Sn^{2+}$ or any combinations thereof.

In some exemplary implementation modes of the disclosure, the B may be $Tm^{2+}$; and $La^{2+}$, $Ce^{2+}$, $Pr^{2+}$, $Nd^{2+}$, $Pm^{2+}$, $Eu^{2+}$, $Gd^{2+}$, $Tb^{2+}$, $Ho^{2+}$, $Er^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, $Pb^{2+}$, $Sn^{2+}$ or any combinations thereof. However, the exemplary implementation modes of the disclosure are not limited this.

In Chemical Formula 1, X may be at least one monovalent anion. For example, the X may be one monovalent anion or a combination of at least two different monovalent anions.

In some exemplary implementation modes of the disclosure, in Chemical Formula 1, the X may be at least one halogen anion, for example, F—, Cl—, Br— or I—. For example, the X in Formula 1 may be at least one halogen anion or a combination of at least two different halogen anions.

In some exemplary implementation modes of the disclosure, the perovskite compound of Chemical Formula 1 may be selected from $[CH_3NH_3][Pb][I]_3$, $[CH_3NH_3][Pb_nSr_{(1-n)}][I]_3$, $[Cs][Pb][I]_3$, $[Rb][Pb][I]_3$, $[K][Pb][I]_3$, $[K][Pb_nSr_{(1-n)}][I]_3$, $[CH_3NH_3][Pb][Br]_3$, $[CH_3NH_3][Pb_nSr_{(1-n)}][Br]_3$, $[CH_3NH_3][Pb_nMg_{(1-n)}][Br]_3$, $[CH_3NH_3][Pb][Cl]_3$, $[CH_3NH_3][Pb_nSr_{(1-n)}][Cl]_3$, $[CH_3NH_3][Pb_nMg_{(1-n)}][C]_3$, n may be a real number that meets a condition of $0<n<1$. For example, the n may be a real number that meets a condition of $0<n\leq0.6$. In some exemplary implementation modes of the disclosure, the n may be a real number that meets a condition of $0.001\leq n\leq0.6$. In some exemplary implementation modes of the disclosure, the n may be a real number that meets a condition of $0.05\leq n\leq0.4$. However, the exemplary implementation modes of the disclosure are not limited this.

Generally, the polymer contains a crystal domain in which polymer chains are regularly arranged and a non-crystal domain in which polymer chains are irregularly arranged. It is not common that the polymer is completely formed by the crystal domain or the non-crystal domain. Generally, the crystal domain and the non-crystal domain are coexistent, so the polymer may generally cause the generation of the crystal domain in a cooling process. In this case, a ratio (percentage) of the crystal domain based on the total polymer may be expressed by a crystallinity of the polymer. In some exemplary implementation modes of the disclosure, the crystallinity of the polymer used is greater than 5%. It is discovered by the inventor that while the crystallinity of the polymer is larger, the prepared fluorescent nanomaterial-polymer composite is better in light stability. Preferably, the crystallinity of the polymer may be 10%, 20%, 30%, 40%, 50%, 60%, 70%, 80%, and 90%. For example, a crystallinity of palm wax is lower than that of polypropylene or polyethylene. While the latter is used as the polymer for dispersing the fluorescent nanomaterial, it is more beneficial to improve the stability of the fluorescent nanomaterial.

In some exemplary implementation modes of the disclosure, the polymer may include at least one component. While the polymer contains multiple components, the first temperature is greater than or equal to a melting point of the component with the highest melting point in the polymer. In this way, at the first temperature, all of the polymers may be in a molten state.

In some exemplary implementation modes of the disclosure, the first temperature is preferably 90-310° C. Specifically, the first temperature may be 90° C., 100° C., 110° C., 120° C., 130° C., 140° C., 150° C., 160° C., 170° C., 180° C., 190° C., 200° C., 210° C., 220° C., 230° C., 240° C., 250° C., 260° C., 270° C., 280° C., 290° C., 300° C., and 310° C. The first temperature is preferably between 90° C. and 220° C., in this way, possible adverse effects on the fluorescent nanomaterial may be further avoided while the first temperature is too high.

For example, the polymer may include at least one of a vinyl polymer, a propenyl polymer, a thiol-ene polymer, a (methyl)acrylate polymer, a carbamate polymer, a carbonate polymer, an epoxy polymer, a paraffin wax and an organosilicon polymer, but it is not limited to this. Specifically, the polymer may be polyethylene, polyvinylidene fluoride, polyvinyl butyral, polyvinyl alcohol, polystyrene, polypropylene, polymethyl acrylate, polymethyl methacrylate (organic glass), polydecylene formamide, polyhexamethylene sebacamide, polyethylene terephthalate, glycol-modified polyethylene terephthalate, polyethylene naphthalate, polycarbonate, cellulose acetate butyrate, palm wax, polymethylphenyl silicone, polydimethylsiloxane and the like. In order to select the polymer with the higher crystallinity, the polymers with good symmetry, unbranched or few branched chains or small side group volumes are preferred.

In order to increase mixing uniformity of the fluorescent nanomaterial and the polymer, the fluorescent nanomaterial-polymer composite with the better dispersion performance is prepared. In some exemplary implementation modes of the disclosure, the precursor further includes a solvent, and the solvent is selected from at least one of a $C_6$-$C_{22}$ amine compound, a nitrogen-containing heterocyclic compound, a $C_6$-$C_{40}$ aliphatic hydrocarbon, a $C_6$-$C_{30}$ aromatic hydrocarbon, a $C_6$-$C_{22}$ phosphine oxide compound, and a $C_{12}$-$C_{22}$ aromatic ether. Specifically, $C_6$-$C_{22}$ alkyl primary amines such as a hexadecylamine, $C_6$-$C_{22}$ alkyl secondary amines such as a dioctyl amine, $C_6$-$C_{40}$ alkyl tertiary amines such as a trioctyl amine, nitrogen-containing heterocyclic compounds such as a pyridine, $C_6$-$C_{40}$ olefins such as an octadecene, $C_6$-$C_{40}$ aliphatic hydrocarbons such as a hexadecane, an octadecane, or a squalane, aromatic hydrocarbons substituted by the $C_6$-$C_{30}$ alkyl such as a toluene, a phenyl dodecane, a phenyl tetradecane, or a phenyl hexadecane, phosphines substituted by the $C_6$-$C_{22}$ alkyl such as a trioctyl phosphine, phosphine oxides substituted by the $C_6$-$C_{22}$ alkyl such as a trioctylphosphine oxide, $C_{12}$-$C_{22}$ aromatic ethers such as a phenyl ether, or a benzyl ether, or a combination thereof. The solvent may be removed in a mode of normal pressure or reduced pressure during a first temperature treatment process.

While the molten polymer is cooled, various modes may be adopted. In an exemplary implementation mode, a cooling process adopts a mode of water cooling or direct cooling in air.

In an exemplary implementation mode, the precursor also includes a hydrocarbon additive. Under the normal pressure, a boiling point of at least one component of the hydrocarbon additive is higher than the first temperature. In this way, at least one component of the hydrocarbon additive may remain in the fluorescent nanomaterial-polymer composite. The hydrocarbon additive is preferably saturated or unsaturated hydrocarbons, such as white oil. It is to be noted that the white oil is also called as paraffin oil or white color oil or mineral oil. It is a mixture of refined liquid-state hydrocarbons obtained from petroleum, mainly a mixture of saturated naphthenic and paraffinic hydrocarbons. Crude oil is obtained by fractionation under normal pressure and reduced pressure, solvent extraction and wax removal, and hydrofining. In some embodiments of the disclosure, the effect of the hydrocarbon additive is extremely important. For a surface generally modified with ligands such as an alkylamine, an alkyl acid, a mercaptan and the like, the fluorescent nanomaterial has the stronger hydrophobicity, and the fluorescent nanomaterial is very poor in compatibility with the polymer, namely the fluorescent nanomaterial may not be effectively dispersed in the polymer.

The addition of the hydrocarbon additive may just make the fluorescent nanomaterial compatible with the polymer, so that the fluorescent nanomaterial does not need to undergo further surface coating and the like. In addition, special dispersion means such as ultrasound may be avoided in a melting process. In some embodiments of the disclosure, it is discovered by the inventor that through adding a suitable content of the hydrocarbon additive, the dispersibility of the fluorescent nanomaterial in the polymer may be effectively increased, and the fluorescent nanomaterial is kept not to be agglomerated in large amounts, thereby the stable luminescence performance is guaranteed.

After the fluorescent nanomaterial-polymer composite is prepared, calculated according to a weight percentage, a content of the white oil in the fluorescent nanomaterial-polymer composite is preferably 0.1% to 5%, and more preferably 0.1%, 0.2%, 0.3%, 0.4%, 0.5%, 0.6%, 0.7%, 0.8%, 0.9%, 1%, 1.5%, 2%, 2.5%, 3%, 3.5%, 4%, 4.5%, and 5%. Preferably it is 1% to 3%.

In some exemplary implementation modes of the disclosure, excited under 450 nm of light, an emission peak wavelength of the fluorescent nanomaterial-polymer composite may be 515-535 nm, namely, in a green light range; the emission peak wavelength of the fluorescent nanomaterial-polymer composite may also be 620-760 nm, namely, in a red light range; the emission peak wavelength of the fluorescent nanomaterial-polymer composite may be greater than 850 nm, namely, in a near-infrared range; and there may be multiple emission peaks of the fluorescent nanomaterial-polymer composite, such as two, there is an emission peak at 515-535 nm and 620-680 nm, namely, in a yellow light range.

In some exemplary implementation modes of the disclosure, a method for preparing a wavelength converting element is provided, including: through forming treatment to the fluorescent nanomaterial-polymer composite mentioned above, the wavelength converting element with a predetermined shape is acquired, and the predetermined shape includes a particle shape, a film shape, a fiber shape, a tube shape, a bubble shape or a bowl shape.

Modes used by the forming treatment include but not limited to coating forming, laminating forming, casting forming, cold press molding, transfer molding, low pressure forming, extrusion forming, extrusion-stretch forming, injection forming and blow forming and the like.

The deformation of the polymer material is achieved by a method such as blow molding or vacuum forming, thereby the wavelength converting element in a three-dimensional shape form is generated, the three-dimensional shape, for example, may be adapted to a bulb shape suitable for an expected application, and may also be adapted to other expected shapes. In addition, because the fluorescent nanomaterial-polymer composite has the better stability and the stronger resistance to water and oxygen damage, it is not necessary to further provide a water and oxygen barrier material on the surface of the wavelength converting element.

Figure 1:
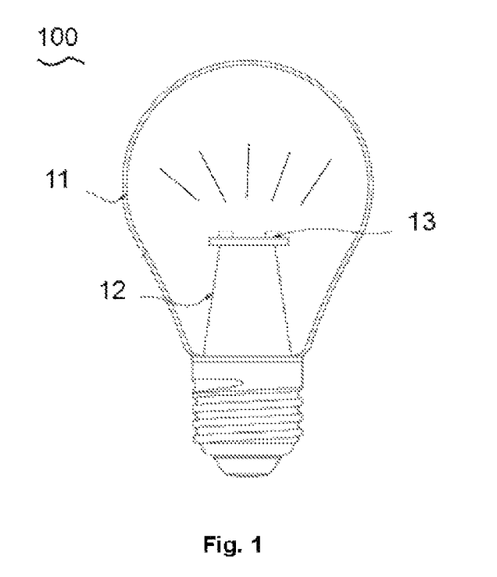
FIG. 1 is a structure schematic diagram of a light emitting device lamp bulb in some embodiments of the disclosure of the disclosure.

In some embodiments of the disclosure, as shown in FIG. 1, a light emitting device is provided. A light emitting device bulb 100 includes a bulb housing 11 (wavelength converting element), a heat transfer column 12, and an LED light source plate 13. The bulb housing 11 is a bubble-shaped body. After the bulb housing 11 receives excitation light from the LED light source plate 13, for example, the excitation light is blue light or purple light, the fluorescent nanomaterial in the bulb housing 11 receives the excitation light and converts it into blue light or red light or infrared light and the like, so as to obtain the bulb 100 with predetermined emission light, and it is satisfied with different application scenarios. For the bulbs with different shapes and types, a shape of the bulb housing 11 is not limited to the bubble shape, for example, it may be a bowl shape, a spiral shape, a sheet shape and the like; and the heat transfer column 12 is not a necessary component in the bulb, and may be replaced by other thermally conductive parts.

Figure 2:
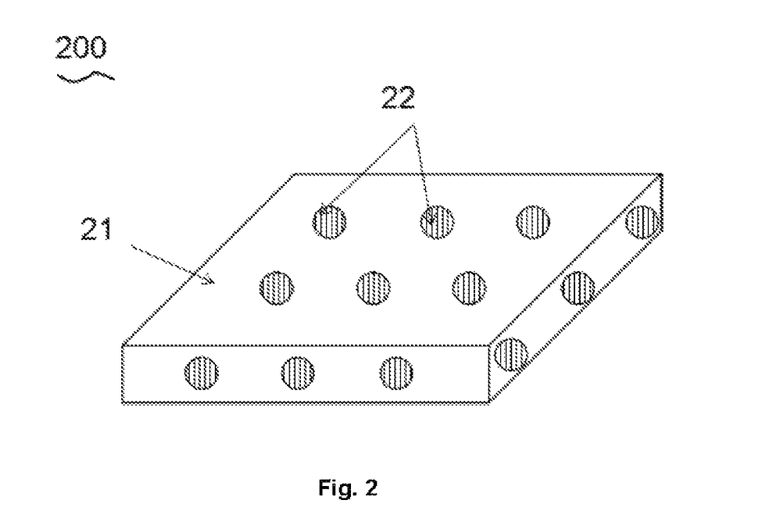
FIG. 2 is a structure schematic diagram of a wavelength converting film in some embodiments of the disclosure of the disclosure.

In some embodiments of the disclosure, as shown in FIG. 2, the wavelength converting element is a wavelength converting film 200, and the wavelength converting film 200 includes a fluorescent nanomaterial 22 and a polymer 21. The fluorescent nanomaterial 22 may emit green light or red light or yellow light.

In some embodiments of the disclosure, the wavelength converting element is prepared by dispersing particles of the fluorescent nanomaterial-polymer composite in a second polymer, the second polymer is the same as or different from the first polymer. While any one direction of the particles of the fluorescent nanomaterial-polymer composite is defined as an X-axis, any one direction perpendicular to the X-axis is defined as a Y-axis, and any one direction perpendicular to a plane formed by the X-axis and the Y-axis is defined as a Z-axis, a particle size of the fluorescent nanomaterial-polymer composite is 0.1 μm or more and 100 μm or less in the X-axis, 0.1 μm or more and 100 μm or less in the Y-axis, and 0.1 μm or more and 100 μm or less in the Z-axis. Preferably, the size of the particles of the fluorescent nanomaterial-polymer composite is 0.1 μm or more and 50 μm or less in the X-axis, Y-axis, and Z-axis; more preferably 1 μm or more and 50 μm or less; and more preferably 1 μm or more and 30 μm or less. The method may make full use of an advantage of the good optical stability of the particles of the fluorescent nanomaterial-polymer composite, and at the same time, the second polymer may be selected according to the demand, thereby advantages of the second polymer are taken into account.

The second polymer may be selected from but not limited to polyethylene, polyvinylidene fluoride, polyvinyl butyral, polyvinyl alcohol, polystyrene, polypropylene, polymethyl acrylate, polymethyl methacrylate (organic glass), polydecylene formamide, polyhexamethylene sebacamide, polyethylene terephthalate, glycol-modified polyethylene terephthalate, polyethylene naphthalate, polycarbonate, cellulose acetate butyrate, polymethylphenyl silicone, polydimethylsiloxane and the like.

The particles of the fluorescent nanomaterial-polymer composite may be prepared by powdering the block-shaped fluorescent nanomaterial-polymer composite through a physical method, such as ball milling or disc reactor milling. It may be understood by those skilled in the art that the brittleness of the polymer is increased while the polymer is at a low temperature, such as a sub-zero temperature, thereby it is more beneficial to the powdering of the polymer, namely modes, such as the ball milling, may be performed at the low temperature.

Figure 3:
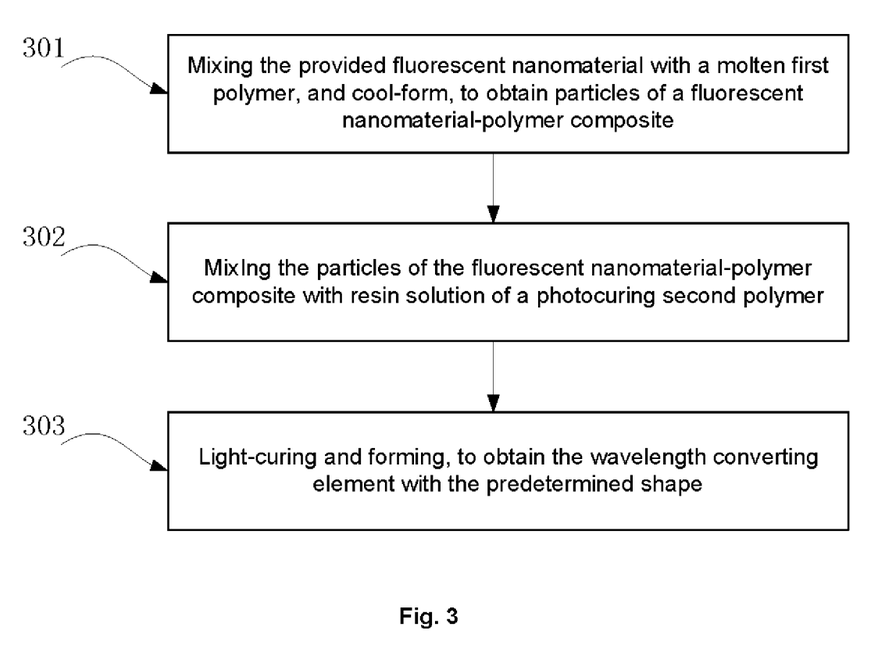
FIG. 3 is a flow diagram of a method for preparing a wavelength converting element in some embodiments of the disclosure of the disclosure.

In some embodiments of the disclosure of the disclosure, as shown in FIG. 3, the method for preparing the wavelength converting element includes the following steps.

Step 301 includes mixing the provided fluorescent nanomaterial with a molten first polymer, forming during cooling, to obtain particles of a fluorescent nanomaterial-polymer composite. The size of the particles of the fluorescent nanomaterial-polymer composite is 0.1 μm or more and 100 μm or less in the X-axis, 0.1 μm or more and 100 μm or less in the Y-axis, and 0.1 μm or more and 100 μm or less in the Z-axis.

Step 302 includes mixing the particles of the fluorescent nanomaterial-polymer composite obtained in Step 301 with resin solution of a photocuring second polymer. Step 303 includes light-curing and forming mixed solution in Step 302, to obtain the wavelength converting element with the predetermined shape.

A matrix resin in a resin of the photocuring second polymer may be at least one of transparent resins such as an unsaturated polyester resin, an epoxy resin acrylic resin, and a thiol/ethylenic monomer photopolymerization system.

Herein, the epoxy acrylate resin may specifically be a bisphenol A epoxy acrylate resin. It may be understood by those skilled in the art that the matrix resin should be the transparent resin.

A photoinitiator may be at least one of ultraviolet photoinitiators such as a benzoin photoinitiator, a benzil photoinitiator, a benzophenone photoinitiator, a thioxanthone photoinitiator, and an anthraquinone photoinitiator, and may also be a photoinitiator such as cyclopentadiene-iron. The benzoin photoinitiator may specifically be: benzoin, benzoin alkyl ether and the like; the benzil photoinitiator may specifically be diphenyl ethyl ketone, 2,4,6-trimethylbenzoyl ethyl phosphonate (TPO-L) and the like; the benzophenone photoinitiator may specifically be benzophenone, 2,4-dihydroxybenzophenone and the like; the thioxanthone photoinitiator may specifically be 2-isopropylthioxanthone (ITX) and the like; and the anthraquinone photoinitiator may specifically be anthraquinone and the like.

Figure 4:
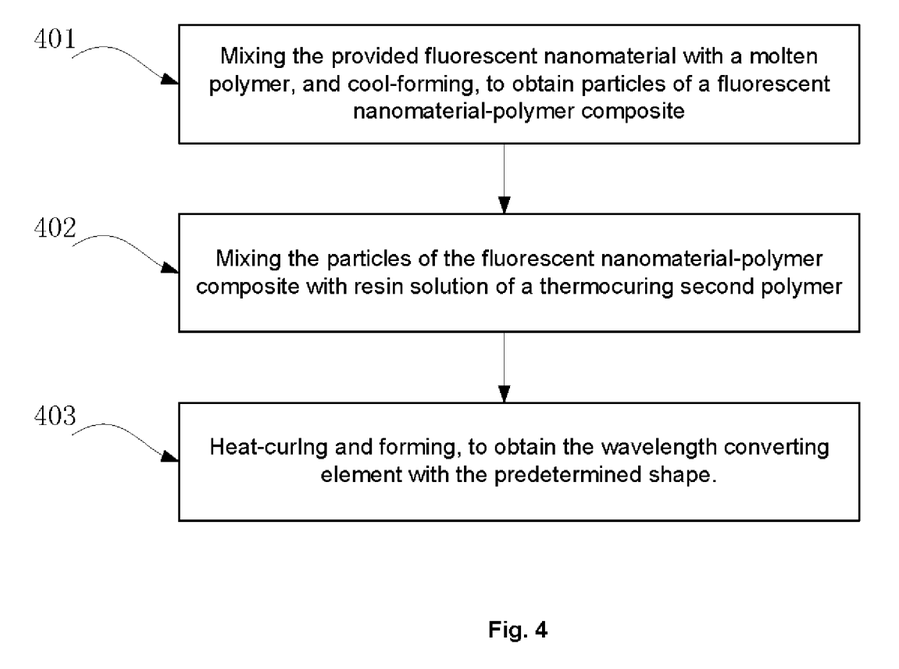
FIG. 4 is a flow diagram of a method for preparing a wavelength converting element in some embodiments of the disclosure of the disclosure.

In some embodiments of the disclosure of the disclosure, as shown in FIG. 4, the method for preparing the wavelength converting element includes the following steps.

Step 401 includes mixing the provided fluorescent nanomaterial with a molten first polymer, cool-forming, to obtain particles of a fluorescent nanomaterial-polymer composite. The size of the particles of the fluorescent nanomaterial-polymer composite is 0.1 μm or more and 100 μm or less in the X-axis, 0.1 μm or more and 100 μm or less in the Y-axis, and 0.1 μm or more and 100 μm or less in the Z-axis.

Step 402 includes mixing the particles of the fluorescent nanomaterial-polymer composite obtained in Step 401 with resin solution of a thermocuring second polymer. Step 403 includes heat-curing and forming mixed solution in Step 402, to obtain the wavelength converting element with the predetermined shape.

The resin of the thermocuring second polymer includes, but is not limited to, a phenol resin, a urea resin, a melamine-formaldehyde resin, an epoxy resin, an unsaturated resin, a polyurethane, and a polyimide and the like.

Figure 5:
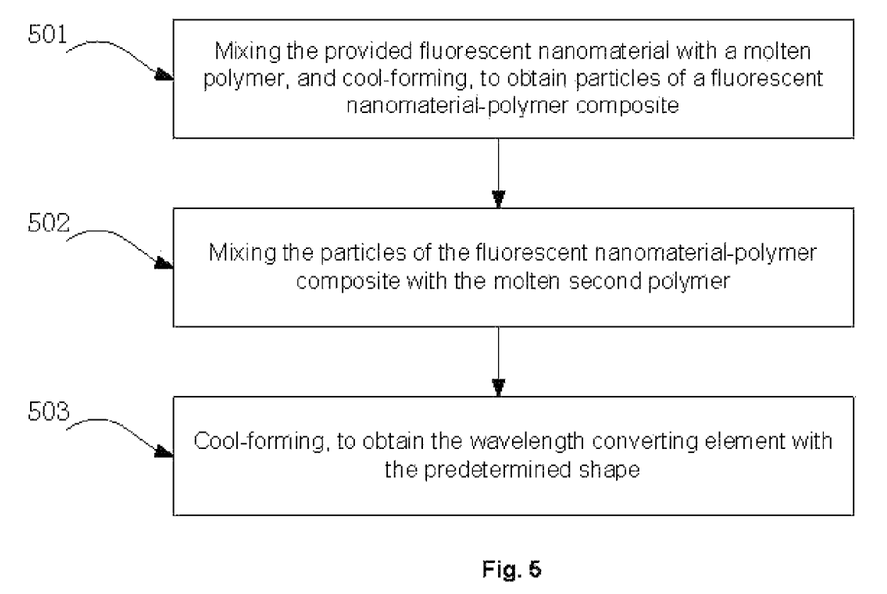
FIG. 5 is a flow diagram of a method for preparing a wavelength converting element in some embodiments of the disclosure of the disclosure.

In some embodiments of the disclosure, as shown in FIG. 5, the method for preparing the wavelength converting element includes the following steps.

Step 501 includes mixing the provided fluorescent nanomaterial with a molten first polymer, cool-forming, to obtain particles of a fluorescent nanomaterial-polymer composite. The size of the particles of the fluorescent nanomaterial-polymer composite is 0.1 μm or more and 100 μm or less in the X-axis, 0.1 μm or more and 100 μm or less in the Y-axis, and 0.1 μm or more and 100 μm or less in the Z-axis.

Step 502 includes mixing the particles of the fluorescent nanomaterial-polymer composite obtained in Step 501 with the molten second polymer. Step 503 includes cool-forming mixed solution in Step 502, to obtain the wavelength converting element with the predetermined shape.

Figure 6:
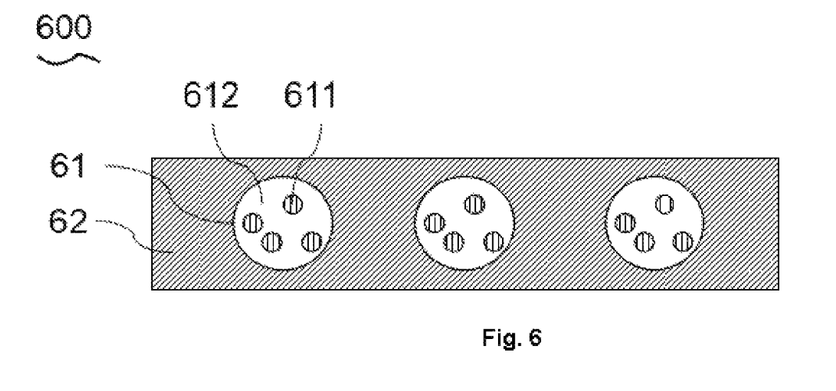
FIG. 6 is a structure schematic diagram of a wavelength converting film in some embodiments of the disclosure of the disclosure.

In some embodiments of the disclosure, as shown in FIG. 6, the wavelength converting element is a wavelength converting film 600. The wavelength converting film 600 includes particles 62 of a fluorescent nanomaterial-polymer composite and a second polymer 62 for dispersing it, the particles 61 of the fluorescent nanomaterial-polymer composite include a fluorescent nanomaterial 611 and a first polymer 612. The fluorescent nanomaterial 611 may emit green light or red light or yellow light. The wavelength converting film 600 may be applied to include but not limited to a backlight module, on-chip lighting and the like.

The perovskite fluorescent nanomaterial-polymer composite according to some exemplary implementation modes of the disclosure is described in more detail below with reference to the following embodiments; however, the exemplary implementation modes of the disclosure are not limited this.

Sources of some materials are listed in Table 1. Unless otherwise specified, all materials are purchased commercially, and used directly.

TABLE 1

| Name | Source |
| --- | --- |
| Polypropylene | Sigma-Aldrich Company, Product Number 427861 |
| Polyethylene | Sigma-Aldrich Company, Product Number 332119 |
| Polystyrene | Macklin Company, Product Number C822866 |
| Polyvinyl butyral | Macklin Company, Product Number P832219 |
| Poly(bisphenol A carbonate) | Sigma-Aldrich Company, Product Number 435139 |
| Palm wax | Macklin Company, Product Number C804521 |
| Polyethylene terephthalate | Sigma-Aldrich Company, Product Number 429252 |
| UV curing acrylic resin | Ailete Adhesive Company |
| Thermocuring epoxy resin | Ailete Adhesive Company |

Preparation Embodiment 1: Preparation of InP/ZnS Quantum Dots 0.4 mmol of indium acetate, 1.2 mmol of palmitic acid, and 10 mL of trioctylamine are placed in a reactor and heated at 120° C. under vacuum. After 1 hour, an atmosphere in the reactor is changed to nitrogen. After the reactor is heated to 280° C., 0.2 mmol of tris(trimethylsilyl)phosphine is rapidly injected therein, and a mixture is reacted. After reaction solution is rapidly cooled to a room temperature (24° C.), acetone is added to it, and an InP core precipitate obtained by centrifuging the mixture is dispersed in toluene.

0.9 mmol of zinc acetate, 1.8 mmol of oleic acid, and 10 mL of trioctylamine are placed in the reactor, and then vacuum-treated at 120° C. for 10 minutes. An atmosphere in the reaction flask is replaced with the nitrogen, and then heated to 280° C. The toluene solution according to the above InP core is added to it within 10 seconds, 2.0 mmol of S-TOP is added to it, and an obtained mixture is reacted for 120 minutes. While the reaction is completed, obtained reaction solution is rapidly cooled to the room temperature (24° C.), ethanol is added to it, and then a precipitate obtained by centrifuging the mixture is dispersed in the toluene to manufacture the InP/ZnS quantum dots.

A fluorescence emission spectrum thereof (an excitation light wavelength is 460 nm) is measured by using Hitachi F-7000 spectrometer, an emission peak is 624 nm, and a half-peak width is about 55 nm.

Embodiment 1: Preparation of Wavelength Converting Film

A suitable amount of the toluene solution of the InP/ZnS quantum dots (the InP/ZnS quantum dots are about 0.5 g) in Preparation Embodiment 1, 1 g of white oil, and 500 g of polypropylene (a melting point is about 230° C.) are taken, and stirred and mixed in glassware at 240° C., toluene is removed during a stirring process, and the InP/ZnS quantum dots are uniformly dispersed in the molten polypropylene, and a wavelength converting film with a thickness of about 200 microns is prepared by casting forming in the air.

Contrast Example 1-1: Preparation of Wavelength Converting Film

A suitable amount of the toluene solution of the InP/ZnS quantum dots (the InP/ZnS quantum dots are about 5 mg) in Preparation Embodiment 1, 20 ml of a toluene solvent, and 0.5 g of polypropylene are taken, and stirred and mixed in glassware at 80 degrees Celsius, so that the InP/ZnS quantum dots are dispersed in swollen polypropylene, after the toluene is removed, a wavelength converting film with a thickness of about 200 microns is prepared by compressing in a mold.

Contrast Example 1-2: Preparation of Wavelength Converting Film

A suitable amount of the toluene solution of the InP/ZnS quantum dots (the InP/ZnS quantum dots about 0.5 g) in Preparation Embodiment 1 and 500 g of a UV-curable acrylic resin are taken and mixed, an organic solvent is removed in vacuum, coating is performed by using a blade coater, and ultraviolet light curing is performed to prepare a wavelength converting film with a thickness of about 200 microns.

Contrast Example 1-3: Preparation of Wavelength Converting Film

A suitable amount of the toluene solution of the InP/ZnS quantum dots (the InP/ZnS quantum dots are about 0.5 g) in Preparation Embodiment 1 and 500 g of a thermocuring epoxy resin are taken and mixed, an organic solvent is removed in vacuum, coating is performed by using a blade coater, and heat-curing is performed to prepare a wavelength converting film with a thickness of about 200 microns.

The wavelength converting films in Embodiment 1, Contrast Example 1-1, Contrast Example 1-2 and Contrast Example 1-3 are placed in an oven with a humidity of 95% and a temperature of 60° C., and 447 nm of a blue backlight source of which an intensity is 50 mW per square centimeter is used to illuminate, the brightness of the wavelength converting films are respectively tested at 0 h, 24 h, 48 h, 96 h, 168 h, 336 h, 672 h, and 1000 h, and the initial brightness (0 h) of the wavelength converting film is marked as 1, ratios of the brightness at different times to the initial brightness are recorded, and test results are shown in Table 2. An instrument used to test the brightness is a PR-670 spectrophotometric radiometer.

TABLE 2

| | 0 h | 24 h | 48 h | 96 h | 168 h | 336 h | 672 h | 1000 h |
|---|---|---|---|---|---|---|---|---|
| Embodiment 1 | 1 | 1.01 | 0.99 | 0.93 | 0.85 | 0.85 | 0.84 | 0.85 |
| Contrast Example 1-1 | 1 | 0.92 | 0.85 | 0.79 | 0.73 | 0.67 | 0.60 | 0.53 |
| Contrast Example 1-2 | 1 | 0.91 | 0.81 | 0.74 | 0.60 | 0.47 | 0.37 | 0.34 |
| Contrast Example 1-3 | 1 | 0.96 | 0.89 | 0.83 | 0.76 | 0.70 | 0.65 | 0.57 |

It may be seen from Table 2 that compared with the existing common swelling method (Contrast Example 1-1), ultraviolet light curing acrylic resin (Contrast Example 1-2), and thermocuring epoxy resin (Contrast Example 1-3), after the wavelength converting film prepared by using the method (Embodiment 1) of dispersing the InP/ZnS quantum dots in the molten polypropylene is aged for 1000 h in the oven with 95% of the humidity and 60° C. of the temperature, the ratios of the brightness and the initial brightness are respectively 0.85, 0.53, 0.34 and 0.57, namely, the brightness of the wavelength converting film in Embodiment 1 may be maintained at 85% of the initial brightness. It is indicated from the above results that the fluorescent nanomaterial-polymer composite and the wavelength converting film prepared by this method have the excellent stability.

Preparation Embodiment 2: Preparation of CuInS2/ZnS Quantum Dots 0.4 mmol of indium acetate, 0.2 mmol of cuprous acetate, 2.4 mmol of oleic acid, 8 mmol of dodecanethiol, and 200 mmol of octadecene are respectively taken, mixed and heated to 50° C. for complete dissolution. After a temperature is raised to 100° C., 4 mL of octadecene solution (0.1 mol/L) in which sulfur powder is dissolved is injected, and reacted for 60 minutes, to generate $CuInS_2$ core solution.

4 mL of zinc stearate octadecene solution (0.1 mol/L) and 4 mL of octadecene solution (0.1 mol/L) in which the sulfur powder is dissolved are added to the above $CuInS_2$ core solution, heated to 180° C. and reacted for 30 minutes, to obtain the $CuInS_2$/ZnS quantum dots, reaction solution is purified with methanol and hexane, and precipitated with acetone, and then a precipitate is dissolved in toluene.

A fluorescence emission spectrum thereof (an excitation light wavelength is 460 nm) is measured by using a Hitachi F-7000 spectrometer, an emission peak is 580 nm, and a half-peak width is about 90 nm.

Embodiment 2: Preparation of Wavelength Converting Film

A suitable amount of the toluene solution of the $CuInS_2$/ZnS quantum dots (the $CuInS_2$/ZnS quantum dots are about 0.5 g) in Preparation Embodiment 2, 0.3 g of white oil, and 500 g of polyethylene (a melting point is about 109-111° C.) are taken, and stirred and mixed in glassware in a high speed at 120° C., it is vacuumized during a stirring process, so that toluene is removed, and the $CuInS_2$/ZnS quantum dots are uniformly dispersed in the molten polyethylene, and a wavelength converting film with a thickness of about 100 microns is prepared by casting forming in the air.

Contrast Example 2-1: Preparation of Wavelength Converting Film

A suitable amount of the toluene solution of the $CuInS_2$/ZnS quantum dots (the $CuInS_2$/ZnS quantum dots are about 5 mg) in Preparation Embodiment 2, 20 ml of a toluene solvent, and 0.5 g of polyethylene are taken, and stirred and mixed in glassware at 80 degrees Celsius, so that the $CuInS_2$/ZnS quantum dots are dispersed in swollen polyethylene, after the toluene is removed, a wavelength converting film with a thickness of about 100 microns is prepared by compressing in a mold.

Contrast Example 2-2: Preparation of Wavelength Converting Film

A suitable amount of the toluene solution of the $CuInS_2$/ZnS quantum dots (the $CuInS_2$/ZnS quantum dots about 0.5 g) in Preparation Embodiment 2 and 500 g of a UV-curable acrylic resin are taken and mixed, an organic solvent is removed in vacuum, coating is performed by using a blade coater, and ultraviolet light curing is performed to prepare a wavelength converting film with a thickness of about 100 microns.

Contrast Example 2-3: Preparation of Wavelength Converting Film

A suitable amount of the toluene solution of the $CuInS_2$/ZnS quantum dots (the $CuInS_2$/ZnS quantum dots are about 0.5 g) in Preparation Embodiment 2 and 500 g of a thermocuring epoxy resin are taken and mixed, an organic solvent is removed in vacuum, coating is performed by using a blade coater, and heat-curing is performed to prepare a wavelength converting film with a thickness of about 100 microns.

The wavelength converting films in Embodiment 2, Contrast Example 2-1, Contrast Example 2-2 and Contrast Example 2-3 are placed in an oven with a humidity of 95% and a temperature of 60° C., and 447 nm of a blue backlight source of which an intensity is 50 mW per square centimeter is used to illuminate, the brightness of the wavelength converting films are respectively tested at 0 h, 24 h, 48 h, 96 h, 168 h, 336 h, 672 h, and 1000 h, and the initial brightness of the wavelength converting film is marked as 1, ratios of the brightness at different times to the initial brightness are recorded, and test results are shown in Table 3. An instrument used to test the brightness is a PR-670 spectrophotometric radiometer.

TABLE 3

|   | 0 h | 24 h | 48 h | 96 h | 168 h | 336 h | 672 h | 1000 h |
|---|---|---|---|---|---|---|---|---|
| Embodiment 2 | 1 | 0.95 | 0.91 | 0.86 | 0.82 | 0.78 | 0.75 | 0.73 |
| Contrast Example 2-1 | 1 | 0.83 | 0.65 | 0.51 | 0.39 | 0.25 | 0.18 | 0.15 |
| Contrast Example 2-2 | 1 | 0.85 | 0.74 | 0.65 | 0.57 | 0.49 | 0.42 | 0.35 |
| Contrast Example 2-3 | 1 | 0.92 | 0.85 | 0.79 | 0.72 | 0.62 | 0.55 | 0.48 |

It may be seen from Table 3 that compared with the existing common swelling method (Contrast Example 2-1), ultraviolet light curing acrylic resin (Contrast Example 2-2), and thermocuring epoxy resin (Contrast Example 2-3), after the wavelength converting film prepared by using the method (Embodiment 2) of dispersing the $CuInS_2$/ZnS quantum dots in the molten polyethylene is aged for 1000 h in the oven with 95% of the humidity and 60° C. of the temperature, the ratios of the brightness and the initial brightness are respectively 0.73, 0.15, 0.35 and 0.48, the stability of the wavelength converting film in Embodiment 2 is far greater than the stability of the wavelength converting films in Contrast Example 2-1, Contrast Example 2-2, and Contrast Example 2-3. It is indicated from the above that the fluorescent nanomaterial-polymer composite and the wavelength converting film prepared by this method have the excellent stability.

Preparation Embodiment 3: Preparation of CdZnSe/ZnSe Quantum Dots

A basic zinc carbonate (0.33 g, 0.6 mmol), an oleic acid (2.1 g, 0.75 mmol) and 10 mL of ODE are weighed in 100 mL of a three-necked flask, air is exhausted with an inert gas for 10 minutes and then a temperature is raised to 280° C., to obtain clear solution. The clear solution is cooled to 180° C., and 1 mL of 0.5 mmol/mL Se-ODE suspension is injected into it, and reacted for 10 minutes. Subsequently, 2 mL of 0.2 mmol/mL cadmium oleate solution is injected into it, and after reacting for 10 minutes, 1 mL of 0.5 mmol/mL Se-ODE suspension is continuously injected, reacted for 10 minutes, and then 0.5 mL of 2 mmol/mL Se-TBP is continuously added, the temperature is raised to 310° C., and the reaction is continued for 60 minutes, to obtain CdZnSe/ZnSe quantum dots. Reaction solution is purified with methanol and hexane, and precipitated with acetone, and then a precipitate is dissolved in toluene.

A fluorescence emission spectrum thereof (an excitation light wavelength is 460 nm) is measured by using a Hitachi F-7000 spectrometer, an emission peak is 525 nm, and a half-peak width is about 23 nm.

Embodiment 3: Preparation of Wavelength Converting Film

A suitable amount of the toluene solution of the CdZnSe/ZnSe quantum dots (the CdZnSe/ZnSe quantum dots are about 0.5 g) in Preparation Embodiment 3, 0.5 g of white oil, and 500 g of polystyrene (a melting point is about 93° C.) are taken, and stirred and mixed in glassware in a high speed at 100° C., toluene is removed during a stirring process, and the CdZnSe/ZnSe quantum dots are uniformly dispersed in the molten polystyrene, and a wavelength converting film with a thickness of about 200 microns is prepared by casting forming in the air.

Contrast Example 3-1: Preparation of Wavelength Converting Film

A suitable amount of the toluene solution of the CdZnSe/ZnSe quantum dots (the CdZnSe/ZnSe quantum dots are about 5 mg) in Preparation Embodiment 3, 20 ml of a toluene solvent, and 0.5 g of polystyrene are taken, and stirred and mixed in glassware at 80 degrees Celsius, so that the CdZnSe/ZnSe quantum dots are dispersed in swollen polystyrene, after the toluene is removed, a wavelength converting film with a thickness of about 200 microns is prepared by compressing in a mold.

Contrast Example 3-2: Preparation of Wavelength Converting Film

A suitable amount of the toluene solution of the CdZnSe/ZnSe quantum dots (the CdZnSe/ZnSe quantum dots about 0.5 g) in Preparation Embodiment 3 and 500 g of a UV-curable acrylic resin are taken and mixed, an organic solvent is removed in vacuum, coating is performed by using a blade coater, and ultraviolet light curing is performed to prepare a wavelength converting film with a thickness of about 200 microns.

Contrast Example 3-3: Preparation of Wavelength Converting Film

A suitable amount of the toluene solution of the CdZnSe/ZnSe quantum dots (the CdZnSe/ZnSe quantum dots are about 0.5 g) in Preparation Embodiment 3 and 500 g of a thermocuring epoxy resin are taken and mixed, an organic solvent is removed in vacuum, coating is performed by using a blade coater, and heat-curing is performed to prepare a wavelength converting film with a thickness of about 200 microns.

The wavelength converting films in Embodiment 3, Contrast Example 3-1, Contrast Example 3-2 and Contrast Example 3-3 are placed in an oven with a humidity of 95% and a temperature of 60° C., and 447 nm of a blue backlight source of which an intensity is 50 mW per square centimeter is used to illuminate, the brightness of the wavelength converting films are respectively tested at 0 h, 24 h, 48 h, 96 h, 168 h, 336 h, 672 h, and 1000 h, and the initial brightness of the wavelength converting film is marked as 1, ratios of the brightness at different times to the initial brightness are recorded, and test results are shown in Table 4. An instrument used to test the brightness is a PR-670 spectrophotometric radiometer.

TABLE 4

|  | 0 h | 24 h | 48 h | 96 h | 168 h | 336 h | 672 h | 1000 h |
|---|---|---|---|---|---|---|---|---|
| Embodiment 3 | 1 | 1.03 | 1.06 | 1.04 | 0.97 | 0.95 | 0.96 | 0.95 |
| Contrast Example 3-1 | 1 | 1.02 | 0.99 | 0.96 | 0.80 | 0.75 | 0.64 | 0.53 |
| Contrast Example 3-2 | 1 | 0.90 | 0.86 | 0.81 | 0.75 | 0.68 | 0.53 | 0.35 |
| Contrast Example 3-3 | 1 | 0.96 | 0.93 | 0.88 | 0.83 | 0.76 | 0.72 | 0.61 |

It may be seen from Table 4 that compared with the existing common swelling method (Contrast Example 3-1), ultraviolet light curing acrylic resin (Contrast Example 3-2), and thermocuring epoxy resin (Contrast Example 3-3), after the wavelength converting film prepared by using the method (Embodiment 3) of dispersing the CdZnSe/ZnSe quantum dots in the molten polystyrene is aged for 1000 h in the oven with 95% of the humidity and 60° C. of the temperature, the ratios of the brightness and the initial brightness are respectively 0.95, 0.53, 0.35 and 0.61, namely the brightness of the wavelength converting film in Embodiment 3 is kept basically unchanged. It is indicated from the above that the fluorescent nanomaterial-polymer composite and the wavelength converting film prepared by this method have the excellent stability.

Preparation Embodiment 4: Preparation of CsPbBr$_3$ Quantum Dots 0.407 g of Cs$_2$CO$_3$ is weighed, 15 mL of octadecene and 1.25 mL of oleic acid are measured, air is exhausted with nitrogen and it is protected, heated to 120° C. and kept for 1 hour, to obtain transparent Cs precursor solution, it is cooled for later use.

In 50 mL of glassware, 5 mL of 1-octadecene and 0.069 g of PbBr$_2$ are taken, air is exhausted with nitrogen at 120° C. and it is stirred for 1 h; and 0.5 mL of oleylamine and 0.5 mL of oleic acid are added, and then a temperature is raised to 150° C., it is stirred for 1 h. Subsequently, 0.6 mL of the Cs precursor solution is rapidly injected into it, and heating is stopped after 5 seconds of the reaction. After 10 seconds, it is placed in ice water for cooling, to obtain a yellow-green coagulated colloid, it is taken out and naturally warmed to a room temperature.

Obtained yellow-green liquid is centrifuged at 1000 r/min of a revolution speed for 5 min, supernatant is collected and centrifuged at 12000 r/min of a revolution speed for 10 min, a bottom precipitate is taken, 1.5 mL of toluene is added to the precipitate, and it is ultrasonically dispersed, to obtain toluene solution of the CsPbBr$_3$ quantum dots, it is put into a glass bottle, sealed and preserved at a room temperature.

A fluorescence emission spectrum thereof (an excitation light wavelength is 460 nm) is measured by using a Hitachi F-7000 spectrometer, an emission peak is 519 nm, and a half-peak width is about 18 nm.

Embodiment 4: Preparation of Wavelength Converting Film

A suitable amount of the toluene solution of the CsPbBr$_3$ quantum dots (the CsPbBr$_3$ quantum dots are about 0.5 g) in Preparation Embodiment 4, 1 g of white oil, and 500 g of polyvinyl butyral (a melting point is about 165-185° C.) are taken, and stirred and mixed in glassware in a high speed at 200° C., toluene is removed during a stirring process, and the CsPbBr$_3$ quantum dots are uniformly dispersed in the molten polyvinyl butyral, and a wavelength converting film with a thickness of about 300 microns is prepared by casting forming in the air.

Contrast Example 4-1: Preparation of Wavelength Converting Film

A suitable amount of the toluene solution of the CsPbBr$_3$ quantum dots (the CsPbBr$_3$ quantum dots are about 5 mg) in Preparation Embodiment 4, 20 ml of a toluene solvent, and 0.5 g of polyvinyl butyral are taken, and stirred and mixed in glassware at 80 degrees Celsius, so that the CsPbBr$_3$ quantum dots are dispersed in swollen polyvinyl butyral, after the toluene is removed, a wavelength converting film with a thickness of about 300 microns is prepared by compressing in a mold.

Contrast Example 4-2: Preparation of Wavelength Converting Film

A suitable amount of the toluene solution of the CsPbBr$_3$ quantum dots (the CsPbBr$_3$ quantum dots about 0.5 g) in Preparation Embodiment 4 and 500 g of a UV-curable acrylic resin are taken and mixed, an organic solvent is removed in vacuum, coating is performed by using a blade coater, and ultraviolet light curing is performed to prepare a wavelength converting film with a thickness of about 300 microns.

Contrast Example 4-3: Preparation of Wavelength Converting Film

A suitable amount of the toluene solution of the CsPbBr$_3$ quantum dots (the CsPbBr$_3$ quantum dots are about 0.5 g) in Preparation Embodiment 4 and 500 g of a thermocuring epoxy resin are taken and mixed, an organic solvent is removed in vacuum, coating is performed by using a blade coater, and heat-curing is performed to prepare a wavelength converting film with a thickness of about 300 microns.

The wavelength converting films in Embodiment 4, Contrast Example 4-1, Contrast Example 4-2 and Contrast Example 4-3 are placed in an oven with a humidity of 95% and a temperature of 60° C., and 447 nm of a blue backlight source of which an intensity is 50 mW per square centimeter is used to illuminate, the brightness of the wavelength converting films are respectively tested at 0 h, 24 h, 48 h, 96 h, 168 h, 336 h, 672 h, and 1000 h, and the initial brightness of the wavelength converting film is marked as 1, ratios of the brightness at different times to the initial brightness are recorded, and test results are shown in Table 5. An instrument used to test the brightness is a PR-670 spectrophotometric radiometer.

TABLE 5

|  | 0 h | 24 h | 48 h | 96 h | 168 h | 336 h | 672 h | 1000 h |
|---|---|---|---|---|---|---|---|---|
| Embodiment 4 | 1 | 1.05 | 1.13 | 1.08 | 1.04 | 0.96 | 0.97 | 0.98 |
| Contrast Example 4-1 | 1 | 0.93 | 0.80 | 0.74 | 0.62 | 0.53 | 0.42 | 0.34 |
| Contrast Example 4-2 | 1 | 0.91 | 0.80 | 0.71 | 0.62 | 0.50 | 0.39 | 0.33 |
| Contrast Example 4-3 | 1 | 0.94 | 0.87 | 0.81 | 0.76 | 0.69 | 0.64 | 0.56 |

It may be seen from Table 5 that compared with the existing common swelling method (Contrast Example 4-1), ultraviolet light curing acrylic resin (Contrast Example 4-2), and thermocuring epoxy resin (Contrast Example 4-3), after the wavelength converting film prepared by using the method (Embodiment 4) of dispersing the $CsPbBr_3$ quantum dots in the molten polyvinyl butyral is aged for 1000 h in the oven with 95% of the humidity and 60° C. of the temperature, the ratios of the brightness and the initial brightness are respectively 0.98, 0.34, 0.33 and 0.56, namely the brightness of the wavelength converting film in Embodiment 4 is kept basically unchanged. It is indicated from the above that the fluorescent nanomaterial-polymer composite and the wavelength converting film prepared by this method have the excellent stability.

Preparation Embodiment 5: Preparation of CdSe/CdZnS Nanodisks 340 mg of Cd(myr)2 (0.6 mmol) and 30 mL of ODE are introduced into a three-necked flask and degassed in vacuum. A mixture is heated at 250° C. under an argon flow, and 2 mL of a dispersion of 100 meshes of Se ultrasonically treated in ODE (0.1 M) is rapidly injected. After 30 seconds, 160 mg of $Cd(OAc)_2$ (0.6 mmol) is introduced. The mixture is heated at 250° C. for 10 minutes. The CdSe core nanodisks are obtained.

In a three-necked flask, 30 mL of trioctylamine is introduced and degassed at 100° C. in vacuum. Subsequently, a reaction mixture is heated at 300° C. under argon, and rapidly injected into 10 mL of the above CdSe core nanodisks, and then 14 mL of 0.2 M octanethiol solution in octadecene, 7 mL of 0.1 M $Cd(OA)_2$ in octadecene and 7 mL of 0.1 M $Zn(OA)_2$ in octadecene are injected at a constant rate with an injection pump during 90 minutes. After adding, the reaction is heated at 300° C. for 90 minutes to prepare a CdZnS housing layer. The CdSe/CdZnS nanodisks are obtained, reaction solution is purified with methanol and hexane, and precipitated with acetone, and then a precipitate is dissolved in toluene.

A fluorescence emission spectrum thereof (an excitation light wavelength is 460 nm) is measured by using a Hitachi F-7000 spectrometer, an emission peak is 550 nm, and a half-peak width is about 10 nm.

Embodiment 5: Preparation of Wavelength Converting Film

A suitable amount of the toluene solution of the CdSe/CdZnS nanodisks (the CdSe/CdZnS nanodisks are about 0.5 g) in Preparation Embodiment 5, 2 g of white oil, and 500 g of poly (bisphenol A carbonate) (a melting point is about 300° C.) are taken, and stirred and mixed in glassware at 310° C., toluene is removed during a stirring process, and the CdSe/CdZnS nanodisks are uniformly dispersed in the molten poly (bisphenol A carbonate), and a wavelength converting film with a thickness of about 200 microns is prepared by casting forming in the air.

Contrast Example 5-1: Preparation of Wavelength Converting Film

A suitable amount of the toluene solution of the CdSe/CdZnS nanodisks (the CdSe/CdZnS nanodisks are about 5 mg) in Preparation Embodiment 5, 20 ml of a toluene solvent, and 0.5 g of poly (bisphenol A carbonate) are taken, and stirred and mixed in glassware at 80 degrees Celsius, so that the CdSe/CdZnS nanodisks are dispersed in swollen poly (bisphenol A carbonate), after the toluene is removed, a wavelength converting film with a thickness of about 200 microns is prepared by compressing in a mold.

Contrast Example 5-2: Preparation of Wavelength Converting Film

A suitable amount of the toluene solution of the CdSe/CdZnS nanodisks (the CdSe/CdZnS nanodisks about 0.5 g) in Preparation Embodiment 5 and 500 g of a UV-curable acrylic resin are taken and mixed, an organic solvent is removed in vacuum, coating is performed by using a blade coater, and ultraviolet light curing is performed to prepare a wavelength converting film with a thickness of about 200 microns.

Contrast Example 5-3: Preparation of Wavelength Converting Film

A suitable amount of the toluene solution of the CdSe/CdZnS nanodisks (the CdSe/CdZnS nanodisks are about 0.5 g) in Preparation Embodiment 5 and 500 g of a thermocuring epoxy resin are taken and mixed, an organic solvent is removed in vacuum, coating is performed by using a blade coater, and heat-curing is performed to prepare a wavelength converting film with a thickness of about 200 microns.

The wavelength converting films in Embodiment 5, Contrast Example 5-1, Contrast Example 5-2 and Contrast Example 5-3 are placed in an oven with a humidity of 95% and a temperature of 60° C., and 447 nm of a blue backlight source of which an intensity is 50 mW per square centimeter is used to illuminate, the brightness of the wavelength converting films are respectively tested at 0 h, 24 h, 48 h, 96 h, 168 h, 336 h, 672 h, and 1000 h, and the initial brightness of the wavelength converting film is marked as 1, ratios of the brightness at different times to the initial brightness are recorded, and test results are shown in Table 6. An instrument used to test the brightness is a PR-670 spectrophotometric radiometer.

TABLE 6

|  | 0 h | 24 h | 48 h | 96 h | 168 h | 336 h | 672 h | 1000 h |
| --- | --- | --- | --- | --- | --- | --- | --- | --- |
| Embodiment 5 | 1 | 0.94 | 0.87 | 0.83 | 0.76 | 0.71 | 0.66 | 0.60 |
| Contrast Example 5-1 | 1 | 0.88 | 0.76 | 0.65 | 0.53 | 0.40 | 0.29 | 0.23 |
| Contrast Example 5-2 | 1 | 0.90 | 0.77 | 0.69 | 0.58 | 0.47 | 0.38 | 0.25 |
| Contrast Example 5-3 | 1 | 0.86 | 0.75 | 0.66 | 0.55 | 0.45 | 0.37 | 0.28 |

It may be seen from Table 6 that compared with the existing common swelling method (Contrast Example 5-1), ultraviolet light curing acrylic resin (Contrast Example 5-2), and thermocuring epoxy resin (Contrast Example 5-3), after the wavelength converting film prepared by using the method (Embodiment 5) of dispersing the CdSe/CdZnS nanodisks in the molten poly (bisphenol A carbonate) is aged for 1000 h in the oven with 95% of the humidity and 60° C. of the temperature, the ratios of the brightness and the initial brightness are respectively 0.60, 0.23, 0.25 and 0.28. It is indicated from the above that the fluorescent nanomaterial-polymer composite and the wavelength converting film prepared by this method have the excellent stability.

Embodiment 6: Preparation of Wavelength Converting Film

A suitable amount of the toluene solution of the CdZnSe/ZnSe quantum dots (the CdZnSe/ZnSe quantum dots are about 0.5 g) in Preparation Embodiment 3, 1 g of white oil, and 500 g of palm wax (a melting point is about 81-86° C.) are taken, and stirred and mixed in glassware in a high speed at 90° C., toluene is removed during a stirring process, and the CdZnSe/ZnSe quantum dots are uniformly dispersed in the molten palm wax, and a wavelength converting film with a thickness of about 200 microns is prepared by casting forming in the air.

Embodiment 7: Preparation of Wavelength Converting Film

A suitable amount of the toluene solution of the CdZnSe/ZnSe quantum dots (the CdZnSe/ZnSe quantum dots are about 0.5 g) in Preparation Embodiment 3, 2.5 g of white oil, and 500 g of polyethylene terephthalate (a melting point is about 250-255° C.) are taken, and stirred and mixed in glassware in a high speed at 270° C., toluene is removed during a stirring process, and the CdZnSe/ZnSe quantum dots are uniformly dispersed in the molten polyethylene terephthalate, and a wavelength converting film with a thickness of about 200 microns is prepared by casting forming in the air.

The wavelength converting films in Embodiment 6 and Embodiment 7 are placed in an oven with a humidity of 95% and a temperature of 60° C., and 447 nm of a blue backlight source of which an intensity is 50 mW per square centimeter is used to illuminate, the brightness of the wavelength converting films are respectively tested at 0 h, 24 h, 48 h, 96 h, 168 h, 336 h, 672 h, and 1000 h, and the initial brightness of the wavelength converting film is marked as 1, ratios of the brightness at different times to the initial brightness are recorded, and test results are shown in Table 7. An instrument used to test the brightness is a PR-670 spectrophotometric radiometer.

TABLE 7

| | 0 h | 24 h | 48 h | 96 h | 168 h | 336 h | 672 h | 1000 h |
|---|---|---|---|---|---|---|---|---|
| Embodiment 6 | 1 | 1.02 | 1.01 | 0.95 | 0.92 | 0.87 | 0.85 | 0.86 |
| Embodiment 7 | 1 | 1.02 | 1.07 | 1.08 | 1.04 | 1.01 | 0.98 | 0.98 |

It may be seen from Table 7 that after the wavelength converting film prepared by using the method (Embodiment 6) of dispersing the CdZnSe/ZnSe quantum dots in the molten palm wax is aged for 1000 h in the oven with 95% of the humidity and 60° C. of the temperature, the ratio of the brightness and the initial brightness may be stabilized at about 0.86; and after the wavelength converting film prepared by using the method (Embodiment 7) of dispersing the CdZnSe/ZnSe quantum dots in the molten polyethylene terephthalate is aged for 1000 h in the oven with 95% of the humidity and 60° C. of the temperature, the ratio of the brightness and the initial brightness may be stably and basically consistent with the initial brightness.

Embodiment 8: Preparation of Wavelength Converting Film

A suitable amount of the toluene solution of the CdZnSe/ZnSe quantum dots (the CdZnSe/ZnSe quantum dots are about 0.05 g) in Preparation Embodiment 3, 0.1 g of white oil, and 50 g of polypropylene are taken, and stirred and mixed in glassware in a high speed at 240° C., toluene is removed during a stirring process, and the CdZnSe/ZnSe quantum dots are uniformly dispersed in the molten polypropylene, after cooling in the air, at minus 20 degrees Celsius, a ball milling mode is used, to obtain particles of a fluorescent nanomaterial-polymer composite of which X-axis, Y-axis and Z-axis are all about 10 μm.

25 g of the particles of the above fluorescent nanomaterial-polymer composite and 500 g of polystyrene are taken, and stirred and mixed in glassware in a high speed at 100° C., so that the particles of the fluorescent nanomaterial-polymer composite are uniformly dispersed in the molten polystyrene, and a wavelength converting film with a thickness of about 200 microns is prepared by casting forming in the air.

Embodiment 9: Preparation of Wavelength Converting Film

A suitable amount of the toluene solution of the CdZnSe/ZnSe quantum dots (the CdZnSe/ZnSe quantum dots are about 0.05 g) in Preparation Embodiment 3, 0.1 g of white oil, and 50 g of polypropylene are taken, and stirred and mixed in glassware in a high speed at 240° C., toluene is removed during a stirring process, and the CdZnSe/ZnSe quantum dots are uniformly dispersed in the molten polypropylene, after cooling in the air, at minus 20 degrees Celsius, a ball milling mode is used, to obtain particles of a fluorescent nanomaterial-polymer composite of which X-axis, Y-axis and Z-axis are all about 40 μm.

25 g of the particles of the above fluorescent nanomaterial-polymer composite and 500 g of a UV curing acrylic resin are taken and mixed, an organic solvent is removed in vacuum, coating is performed by using a blade coater, and ultraviolet light curing is performed to prepare a wavelength converting film with a thickness of about 200 microns.

Embodiment 10: Preparation of Wavelength Converting Film

A suitable amount of the toluene solution of the CdZnSe/ZnSe quantum dots (the CdZnSe/ZnSe quantum dots are about 0.05 g) in Preparation Embodiment 3, 0.1 g of white oil, and 50 g of polypropylene are taken, and stirred and mixed in glassware in a high speed at 240° C., toluene is removed during a stirring process, and the CdZnSe/ZnSe quantum dots are uniformly dispersed in the molten polypropylene, after cooling in the air, at minus 20 degrees Celsius, a ball milling mode is used, to obtain particles of a fluorescent nanomaterial-polymer composite of which X-axis, Y-axis and Z-axis are all about 10 μm.

25 g of the particles of the above fluorescent nanomaterial-polymer composite and 500 g of a thermocuring epoxy resin are taken and mixed, an organic solvent is removed in vacuum, coating is performed by using a blade coater, and heat-curing is performed to prepare a wavelength converting film with a thickness of about 200 microns.

The wavelength converting films in Embodiment 8, Embodiment 9 and Embodiment 10 are placed in an oven with a humidity of 95% and a temperature of 60° C., and 447 nm of a blue backlight source of which an intensity is 50 mW per square centimeter is used to illuminate, the brightness of the wavelength converting films are respectively tested at 0 h, 24 h, 48 h, 96 h, 168 h, 336 h, 672 h, and 1000 h, and the initial brightness of the wavelength converting film is marked as 1, ratios of the brightness at different times to the initial brightness are recorded, and test results are shown in Table 8. An instrument used to test the brightness is a PR-670 spectrophotometric radiometer.

TABLE 8

|  | 0 h | 24 h | 48 h | 96 h | 168 h | 336 h | 672 h | 1000 h |
|---|---|---|---|---|---|---|---|---|
| Embodiment 8 | 1 | 1.01 | 1.03 | 1.04 | 1.03 | 1.01 | 1.01 | 0.98 |
| Embodiment 9 | 1 | 1.02 | 1.07 | 1.03 | 1.04 | 1.01 | 0.99 | 1.02 |
| Embodiment 10 | 1 | 1.04 | 1.11 | 1.08 | 1.03 | 1.01 | 0.98 | 0.99 |

It may be seen from Table 8 that after the wavelength converting films prepared by dispersing in the molten second polymer (Embodiment 8) through the existing common method, the second polymer (Embodiment 9) of the UV curing acrylic resin and the second polymer (Embodiment 10) of the thermocuring epoxy resin after the CdZnSe/ZnSe quantum dots are dispersed in the molten polypropylene to prepare the particles of the fluorescent nanomaterial-polymer composite are aged for 1000 h in the oven with 95% of the humidity and 60° C. of the temperature, the ratio of the brightness and the initial brightness may be stably and basically consistent with the initial brightness.

The embodiments of the disclosure have the following beneficial effects.

(1) the fluorescent nanomaterial is mixed with the polymer in a molten state to prepare the fluorescent nanomaterial-polymer composite, the preparation method is simple, and suitable for large-scale preparation;

(2) light stability of the fluorescent nanomaterial-polymer composite and a wavelength converting film is good; and (3) through the forming treatment to the fluorescent nanomaterial-polymer composite, or the forming treatment after dispersing the particles of the fluorescent nanomaterial-polymer composite in the second polymer, the wavelength converting element with the predetermined shape may be obtained, the method is simple in forming, so as to meet the needs of multiple application scenarios Although technical schemes of the disclosure are described and listed in more detail by the inventor, it should be understood by those skilled in the art that it is apparent that modifications and/or replacements are made to the above embodiments or equivalent alternative schemes are adopted, all of these may not be departed from the essence of spirit of the disclosure, the terms appearing in some embodiments of the disclosure are used to describe and understand the technical schemes of the disclosure, and should not constitute limitation to the disclosure.

INDUSTRIAL APPLICABILITY

The schemes provided by the embodiments of the present invention may be applied to a preparation process of a fluorescent nanomaterial-polymer composite. The preparation method includes: at least one precursor provided, the precursor includes a fluorescent nanomaterial and a polymer; in a first temperature at or higher than a melting point of the polymer, the precursor is mixed, and cooled. The fluorescent nanomaterial is mixed with the polymer in a molten state to prepare the fluorescent nanomaterial-polymer composite, and thereby a problem that the fluorescent nanomaterial is poor in stability is solved.

What is claimed is:

1. A method for preparing a fluorescent nanomaterial-polymer composite, wherein the preparation method comprises:
   providing at least one precursor, wherein the precursor comprises a fluorescent nanomaterial and a polymer; and
   in a first temperature at or higher than a melting point of the polymer, mixing the precursor, and then cooling, the precursor further comprises a hydrocarbon additive, the hydrocarbon additive in the precursor remains in a fluorescent nanomaterial-polymer composite, and under a normal pressure, a boiling point of the hydrocarbon additive is higher than the first temperature, the hydrocarbon additive is mineral oil, the hydrocarbon additive comprises a mixture of saturated naphthenic and paraffinic hydrocarbons, a crystallinity of the polymer is greater than 5%.

2. The method for preparing the fluorescent nanomaterial-polymer composite as claimed in claim 1, wherein the fluorescent nanomaterial is selected from at least one of a nanocluster, a quantum dot, a nanorod and a nanodisk.

3. The method for preparing the fluorescent nanomaterial-polymer composite as claimed in claim 1, wherein the first temperature is greater than or equal to a melting point of a polymer with the highest melting point in the polymer, the polymer comprises at least one of a vinyl polymer, a propenyl polymer, a thiol-ene polymer, a (methyl)acrylate polymer, a carbamate polymer, a carbonate polymer, an epoxy polymer, a paraffin wax and an organosilicon polymer.

4. The method for preparing the fluorescent nanomaterial-polymer composite as claimed in claim 1, wherein a value of the first temperature is between 90 and 310° C.

5. The method for preparing the fluorescent nanomaterial-polymer composite as claimed in claim 1, wherein the precursor further comprises a solvent, the solvent is selected from at least one of a $C_6$-$C_{22}$ amine compound, a nitrogen-containing heterocyclic compound, a $C_6$-$C_{40}$ aliphatic hydrocarbon, a $C_6$-$C_{30}$ aromatic hydrocarbon, a $C_6$-$C_{22}$ phosphine oxide compound, and a $C_{12}$-$C_{22}$ aromatic ether.

6. The method for preparing the fluorescent nanomaterial-polymer composite as claimed in claim 1, the method further comprises: performing a forming treatment to the fluorescent nanomaterial-polymer composite thereby forming a wavelength converting element with a shape.

7. The method for preparing the fluorescent nanomaterial-polymer composite as claimed in claim 6, wherein the shape comprises a particle shape, a film shape, a fiber shape, a tube shape, a bubble shape or a bowl shape.

8. The method for preparing the fluorescent nanomaterial-polymer composite as claimed in claim 6, wherein the forming treatment comprises coating forming, laminating forming, casting forming, cold press molding, transfer molding, low pressure forming, extrusion forming, extrusion-stretch forming, injection forming or blow forming.

9. A method for preparing a wavelength converting element, wherein particles of the fluorescent nanomaterial-polymer composite as claimed in claim 1 are dispersed in a second polymer, the second polymer is the same as or different from a first polymer, wherein the first polymer is a polymer as claimed in claim 1; and
   while any one direction of the particles of the fluorescent nanomaterial-polymer composite is defined as an X-axis, any one direction perpendicular to the X-axis is defined as a Y-axis, and any one direction perpendicular to a plane formed by the X-axis and the Y-axis is defined as a Z-axis, a particle size of the fluorescent nanomaterial-polymer composite is 0.1 μm or more and 100 μm or less in the X-axis, 0.1 μm or more and 100 μm or less in the Y-axis, and 0.1 μm or more and 100 μm or less in the Z-axis;

wherein after the particles of the fluorescent nanomaterial-polymer composite according to claim 1 are mixed with resin solution of photocuring second polymer, the wavelength converting element with a shape is obtained by light curing forming; or wherein after the particles of the fluorescent nanomaterial-polymer composite according to claim 1 are mixed with a resin of thermocuring second polymer, the wavelength converting element with a shape is obtained by heat curing forming, or wherein after the particles of the fluorescent nanomaterial-polymer composite according to claim 1 are mixed with molten second polymer, the wavelength converting element with a shape is obtained by forming during cooling.

10. The method for preparing the wavelength converting element as claimed in claim 9, wherein the shape comprises a particle shape, a film shape, a fiber shape, a tube shape, a bubble shape or a bowl shape.

11. A light emitting device, wherein the light emitting device comprises a light source and a wavelength converting element prepared by the method as claimed in claim 9, the wavelength converting element receives light from the light source, and converts it into light with another wavelength.

\* \* \* \* \*